(12) United States Patent
Yu et al.

(10) Patent No.: US 6,548,911 B2
(45) Date of Patent: Apr. 15, 2003

(54) MULTIMEDIA CHIP PACKAGE

(75) Inventors: Kevin Yu, Changhua Hsien (TW); Chien-Ping Huang, Hsinchu Hsien (TW); Che-Jung Chang, Taichung Hsien (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/922,254

(22) Filed: Aug. 3, 2001

(65) Prior Publication Data

US 2002/0066947 A1 Jun. 6, 2002

(30) Foreign Application Priority Data

Dec. 6, 2000 (TW) .......................................... 89125978

(51) Int. Cl.⁷ .............................................. H01L 29/40
(52) U.S. Cl. ................ 257/786; 257/784; 257/777; 257/787; 257/686; 257/685; 257/678
(58) Field of Search ................ 257/685, 686, 257/777, 786, 784, 787, 678

(56) References Cited

U.S. PATENT DOCUMENTS 5,796,164 A * 8/1998 McGraw et al. ............ 257/679

* cited by examiner

Primary Examiner—Nathan J. Flynn
Assistant Examiner—Pershelle Greene
(74) Attorney, Agent, or Firm—J.C. Patents

(57) ABSTRACT

A substrate unit has a first surface and a corresponding second surface, and a plurality of nodes and at least a die pad are formed on the first surface of the substrate unit. A plurality of external nodes is formed on the second surface of the substrate unit, and the external nodes are electrically connected to the nodes. A multimedia chip has an active surface and a corresponding back surface, and a plurality of bonding pads are formed on the active surface of the multimedia chip. The back surface of the multimedia chip is adhered on the die pad of the substrate unit. A molding compound encapsulates the multimedia chip, the first surface of the substrate unit, and the conductive wires, and exposes the second surface of the substrate unit and the external nodes.

10 Claims, 7 Drawing Sheets

MULTIMEDIA CHIP PACKAGE

CROSS-REFERENCE TO RELATED APPLICATION

This application claims the priority benefit of Taiwan application serial no. 89125978, filed Dec. 6, 2000.

BACKGROUND OF THE INVENTION

1. Field of the Invention

The present invention relates generally to packaging techniques, and more particularly, to a multimedia chip package and a fabrication method thereof.

2. Description of the Related Art

Because of the rapid development of information technology, integrated circuits have become essential for daily use. Products formed by integrated circuits appear in all aspects of daily life. Semiconductor technology is continuously developing to be more personal and functional, and complex new electronic products are constantly being developed. As a result, a major trend in the semiconductor industry is to make products even lighter, thinner, smaller and faster, while also making them friendly, convenient, powerful, reliable and increasingly less expensive.

In semiconductor fabrication, semiconductor devices are entering the submicron century by producing 0.18 $\mu$m integrated circuits. As a matter of fact, a much higher-density integrated circuit now can be produced. The fabrication process of an integrated circuit can be separated into three different processes: a fabricating process of a silicon wafer, a fabricating process of an integrated circuit and a packaging process of the integrated circuit. The packaging process of the integrated circuit is the final step for completing the integrated circuit product, and the main purpose of this packaging step is to establish electrical connections from a die to a printed circuit board (PCB) or other devices. Moreover, the packaging process can protect the chips.

A multimedia chip (MMC) package consists of an application-specific integrated circuit (ASIC) controller and a flash memory. The multimedia chip package is usually very thin in order to be applied to MMC products. However, the cost of the multimedia chip package is very high, and the process yield is not good.

FIG. 1 illustrates a cross-sectional view of a conventional MMC package. FIG. 1A is a top view diagram of FIG. 1. In the conventional fabrication process of a MMC package, a substrate (not shown in the diagrams) is provided, which substrate comprises a plurality of substrate units 110 (only one substrate unit is shown in FIG. 1) and connecting bars (not shown in the diagrams). Each substrate unit 110 comprises an upper surface 112 and a corresponding lower surface 114. A plurality of external nodes 116 is located at the periphery of the upper surface 112 of the substrate unit 110 and is also called gold pins. The external nodes 116 can be electrically connected to external circuits. The lower surface 114 of the substrate unit 110 comprises a plurality of die pads and a plurality of nodes 120. At least a multimedia chip 180 has an active surface 182 and a corresponding back surface 184. A plurality of bonding pads 186 is formed on the active surface 182 of the multimedia chip 180.

A die attaching process is carried out to adhere the back surface 184 of the multimedia chip 180 onto the die pad 118 of the substrate unit 110. A plurality of conductive wires 190 electrically connects the bonding pads 186 to the nodes 120. A molding process is carried out next to encapsulate the multimedia chip 180, conductive wires 190 and portions of the lower surface 114 of the substrate units 110 with a molding compound 130. A plurality of packaging units 188 is thus formed (one of the package units is shown in the FIG. 1). Each packaging unit 188 corresponds to each substrate unit 110. A singulation process is carried out to separate each packaging unit by punching or sawing, whereby packaging units are separated from connecting bars. A quality control test is carried out to detect whether or not each packaging unit 188 passes the quality standards. A process of adding a cap to the package unit comprises the following steps. First, an adhesive material 160 is applied on the cap 150, and then the cap 150 with the adhesive material 160 covers the molding compound 130 and a portion of the lower surface 114 of the substrate unit 110. After pressing and heating processes, the cap 150 is firmly secured onto the package unit 188. Finally, a label 152 is adhered on the surface of the cap 150.

From the above-mentioned packaging process, the thickness of the substrate 110 can be approximately 0.3 mm because the thickness of the whole package unit is only approximately 1.4 mm. Therefore the thickness of the substrate has to be very thin, which leads to a warpage problem. This can also lead to a delamination problem, thus affecting the production yield and increasing the cost. The process of adding a cap to the substrate unit is complex, and the material cost of the cap 150 and the adhesive material 160 can increase the production cost. The tolerance between the cap and the package unit, and the adhesive ability between the cap, the adhesive material and the substrate unit 110 can be a problem. Excess adhesive material overflows onto the outer surface of the package unit; therefore, the reliability of the product decreases.

SUMMARY OF THE INVENTION

It is an object of the present invention to provide an improved method for packaging a multimedia chip package without a cap. Since the step of adding a cap is omitted, the whole fabrication process of the multimedia chip package is thus simplified. Therefore, the cost can be reduced, and the production yield is improved.

It is another object of the present invention to provide an improved method and fabrication process for reducing the volume of a multimedia chip package.

To achieve the foregoing and other objects and in accordance with the purpose of the present invention, a multimedia chip package is provided. The multimedia chip package comprises: a substrate unit having a first surface and a corresponding second surface, wherein a plurality of nodes and at least a die pad are formed on the first surface of the substrate unit; a plurality of external nodes is formed on the second surface of the substrate unit and electrically connected to the nodes; at least a multimedia chip having an active surface and a corresponding back surface, wherein a plurality of bonding pads is formed on the active surface of the multimedia chip, the back surface of the multimedia chip is adhered on the die pad of the substrate unit and the bonding pads are electrically connected to the nodes by a plurality of conductive wires; and a molding compound encapsulating the multimedia chip, the first surface of the substrate unit, the conductive wires, and exposing the second surface of the substrate unit and the external nodes.

According to one of the preferred embodiments of the present invention, the external nodes are located near a peripheral region of the second surface of the substrate unit. The shape of the external nodes can be rectangular and square. A label is adhered on the surface of the molding compound.

To achieve the foregoing and other objects and in accordance with the purpose of the present invention, a method of fabricating a multimedia chip package is provided, comprising the following steps. A substrate is provided, which comprises a plurality of connecting bars and at least a package unit. The connecting bars surround the periphery of the package unit, and each package unit contains a substrate unit. The substrate unit has a first surface and a corresponding second surface, and at least a die pad and a plurality of nodes are formed on the first surface of the substrate unit. A plurality of external nodes is formed on the second surface of the substrate unit, and the external nodes are electrically connected to the nodes. At least a multimedia chip is provided and has an active surface and a corresponding back surface. A plurality of bonding pads is formed on the active surface of the multimedia chip. The back surface of the multimedia chip is adhered on the die pad. A wire bonding process is carried out to electrically connect the bonding pads to the nodes. A molding process is carried out in which a mold has at least a cavity that corresponds to the packaging unit of the substrate. The packaging unit of the substrate and the multimedia chip are located in the cavity, and a molding compound is filled into the cavity. The molding compound encapsulates the first surface of the substrate unit, the multimedia chip, the conductive wires, and exposes the second surface of the substrate unit and the external nodes. A singulating process is carried out to separate the package unit of the substrate from the connecting bars of the substrate.

According to one of the preferred embodiments of the present invention, the singulating process comprises a punch method or a sawing method to separate the package unit of the substrate from the connecting bars of the substrate. After the molding process, a label is adhered on the surface of the molding compound. A test is also provided after the singulating process. The external nodes are located near a peripheral region of the second surface of the substrate unit. The external nodes are rectangular or square in shape.

To achieve the foregoing and other objects and in accordance with the purpose of the present invention, another method of fabricating a multimedia chip package is provided, comprising the following steps. A substrate is provided, which comprises a plurality of connecting bars and at least a package unit. The connecting bars surround the periphery of the package unit, and each package unit contains a plurality of substrate units. Every substrate unit has a first surface and a corresponding second surface, and at least a die pad and a plurality of nodes are formed on a first surface of each substrate unit. A plurality of external nodes is formed on a second surface of each substrate unit, and the external nodes are electrically connected to the nodes. A plurality of multimedia chips is provided, and each multimedia chip has an active surface and a corresponding back surface. A plurality of bonding pads is formed on the active surface of each multimedia chip. The back surface of each multimedia chip is adhered on the die pad. A wire bonding process is carried out to electrically connect the bonding pads to the nodes. A molding process is carried out, forming a mold having at least a cavity that corresponds to the packaging unit of the substrate. The packaging unit of the substrate and the multimedia chip are located in the cavity, and the cavity is filled with a molding compound. The molding compound encapsulates the first surface of the substrate unit, the multimedia chip, the conductive wires, and exposes the second surface of the substrate unit and the external nodes. A plurality of packaging units is thus formed. Each packaging unit corresponds to one of the substrate units and one or more of the multimedia chips. A singulating process is carried out to separate the package units of the substrate from the connecting bars of the substrate.

According to one of the preferred embodiments of the present invention, the singulating method is used to separate each packaging unit. A punch method or a sawing method is used to separate each package unit of the substrate from the connecting bars of the substrate. A test is also provided after the singulating process. After the molding process, a label is adhered on the surface of the package material. The external nodes are located near a peripheral region of the second surface of the substrate unit. The shape of the external nodes is rectangular or square.

To achieve the foregoing and other objects and in accordance with the purpose of the present invention, another multimedia chip package is provided, which comprises: a substrate unit having a first surface and a corresponding second surface, wherein a plurality of first nodes, at least a die pad and a plurality of external nodes are formed on the first surface of the substrate unit, and a plurality of second nodes and at least a second die pad are formed on the second surface of the substrate unit, and the external nodes are electrically connected to the first nodes and the second nodes; at least a first multimedia chip having a first active surface and a corresponding first back surface, wherein a plurality of first bonding pads is formed on the first active surface of the first multimedia chip, the first back surface of the first multimedia chip is adhered on the first die pad of the substrate unit, and the first bonding pads are electrically connected to the first nodes by a plurality of first conductive wires; at least a second multimedia chip having a second active surface and a corresponding second back surface, wherein a plurality of second bonding pads is formed on the second active surface of the second multimedia chip, the second back surface of the second multimedia chip is adhered on the second die pad of the substrate unit, and the second bonding pads are electrically connected to the second nodes by a plurality of second conductive wires; and a molding compound encapsulating the first multimedia chip, the second multimedia chip, the first conductive wires, the second conductive wires and a portion of first surface of the substrate unit, wherein the external nodes are exposed.

According to one of the preferred embodiments of the present invention, the molding compound can completely encapsulate the second surface of the substrate unit or partially encapsulate the second surface of the substrate unit. The side surfaces of the substrate unit can be exposed or covered. The external nodes are located near a peripheral region of the first surface of the substrate unit. The external nodes are rectangular or square in shape.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

FIGS. 2 to 5 are schematic views illustrating steps of a fabrication method of a multimedia chip (MMC) package in accordance with a first embodiment of the present invention. FIG. 2A is a schematic top view of FIG. 2.

Figure 1:
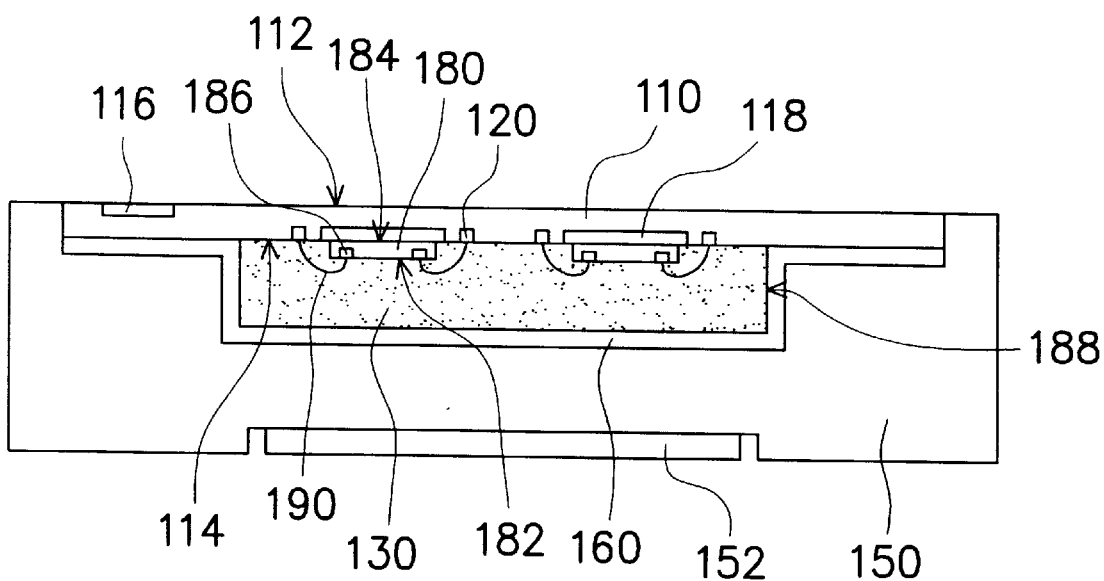
FIG. 1 is a schematic cross-sectional view of a conventional multimedia chip package.
Figure 1A:
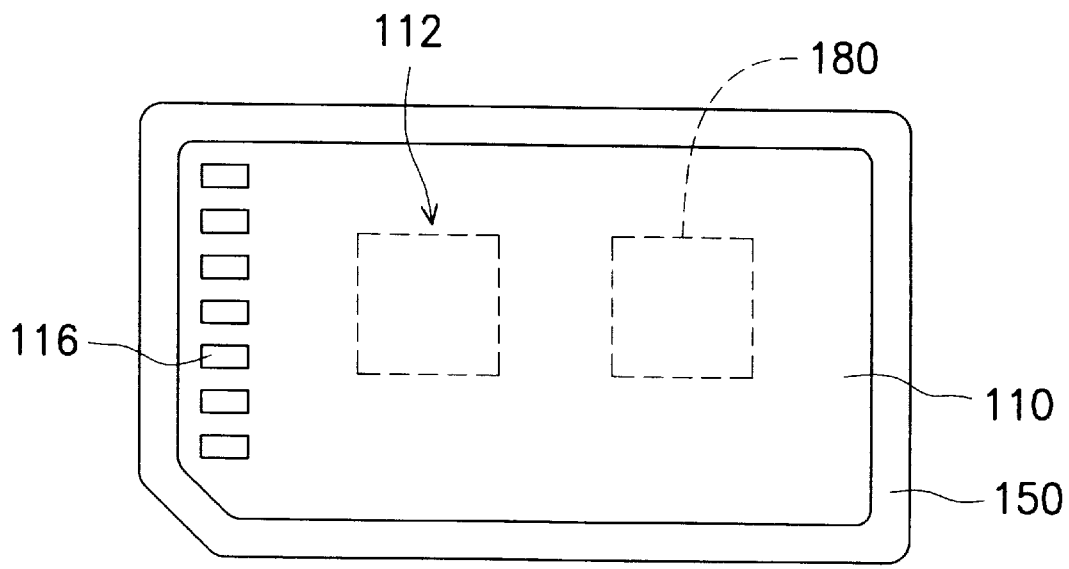
FIG. 1A is a schematic top view of FIG. 1.
Figure 2:
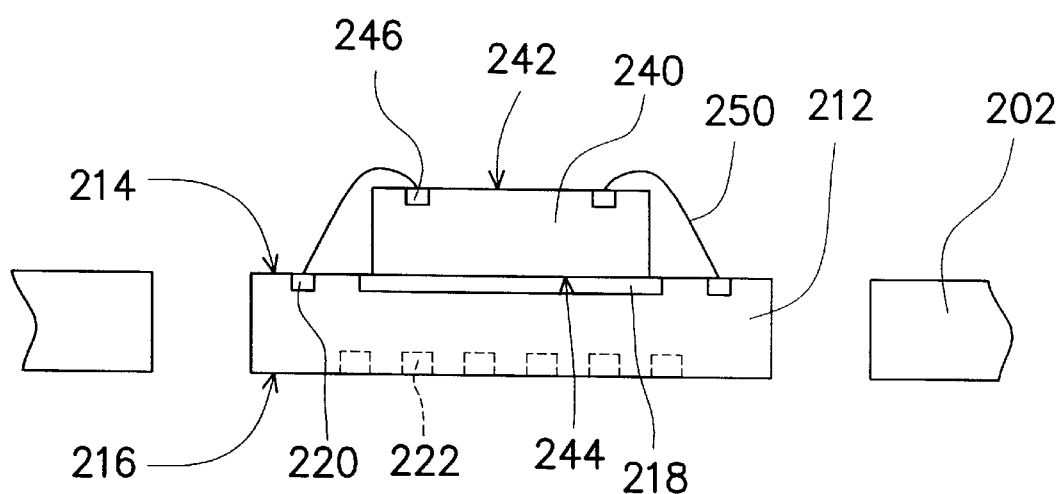
FIGS. 2 to 5 are schematic cross-sectional views illustrating steps of a fabrication method of a multimedia chip package in accordance with a first embodiment of the present invention.
Figure 2A:
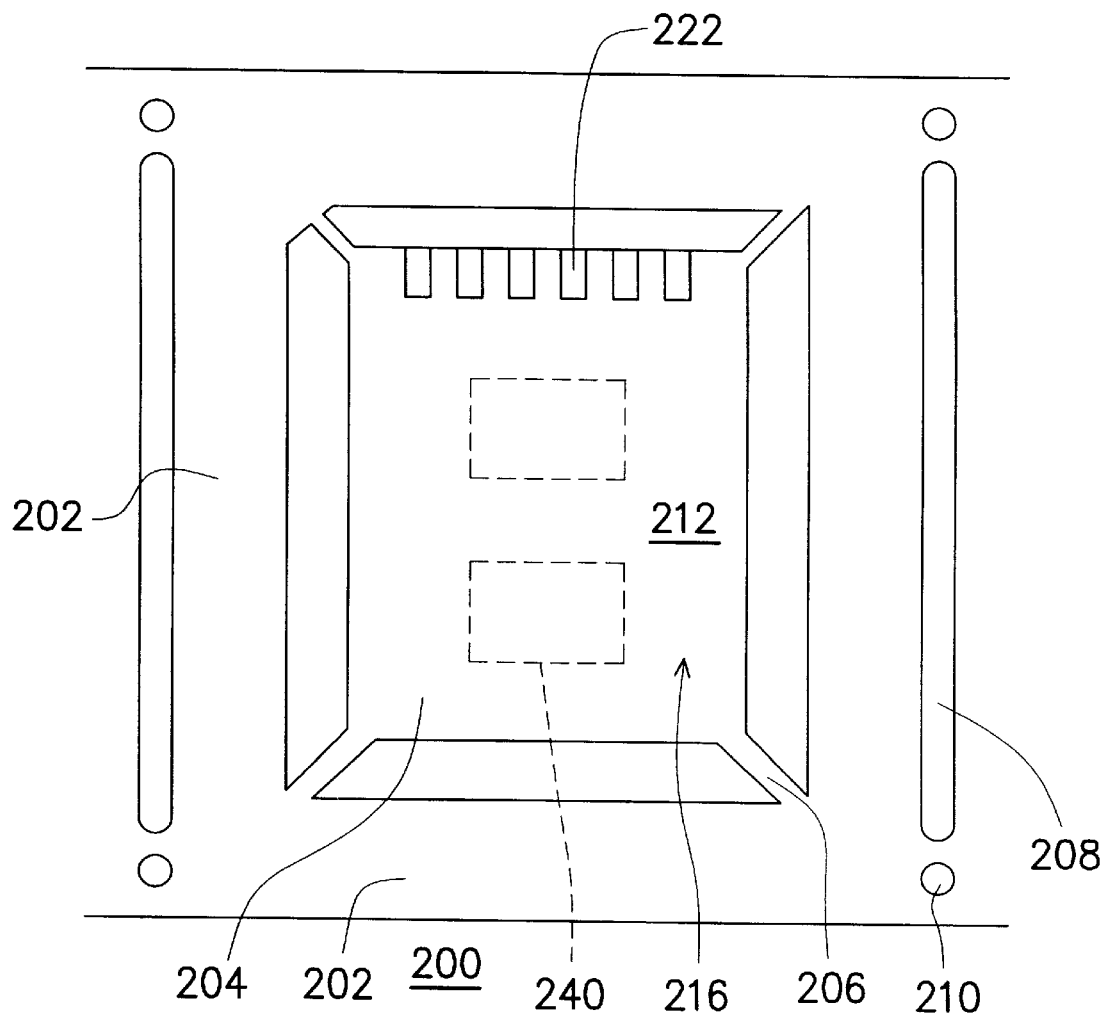
FIG. 2A is a schematic top view of FIG. 2.

Referring to FIG. 2 and FIG. 2A, a substrate 200 having a plurality of connecting bars 202 and a plurality of packaging units 204 (only one is shown in FIG. 2A) is provided. The connecting bars 202 are located around the periphery of the packaging units 204, and the packaging units 204 are connected to the connecting bars 202 through a supporting bar 206. A plurality of slots 208 is formed on the substrate 200 and is located between the neighboring packaging units 204. Holes 210 are formed at both ends of each slot 208. Each package unit 204 has one substrate unit 212, and each substrate unit is an independent operating circuit structure. After completing the fabrication process, each product comprises one substrate unit 212 having a first surface 214 and a corresponding second surface 216. At least a die pad 218 and a plurality of nodes 220 are formed on the first surface 214 of the substrate unit 212. A plurality of external nodes 222 that can electrically connect to the external circuits (not shown in the diagrams) is formed on the second surface 216 of the substrate unit 200. The external nodes 222 can be a square or a rectangular shape and are electrically connected to the nodes 220.

A plurality of multimedia chips 240 is provided, wherein each chip has an active surface 242 and a corresponding back surface 244. A plurality of bonding pads 246 is formed on the active surface 242 of each multimedia chip 240. A die attaching process follows, and the back surface 244 of the multimedia chip 240 adheres on the corresponding die pad 218 of the substrate unit 212. A wire bonding process is carried out in which a plurality of conductive wires 250 electrically connects the bonding pads 246 to the nodes 220.

Figure 3:
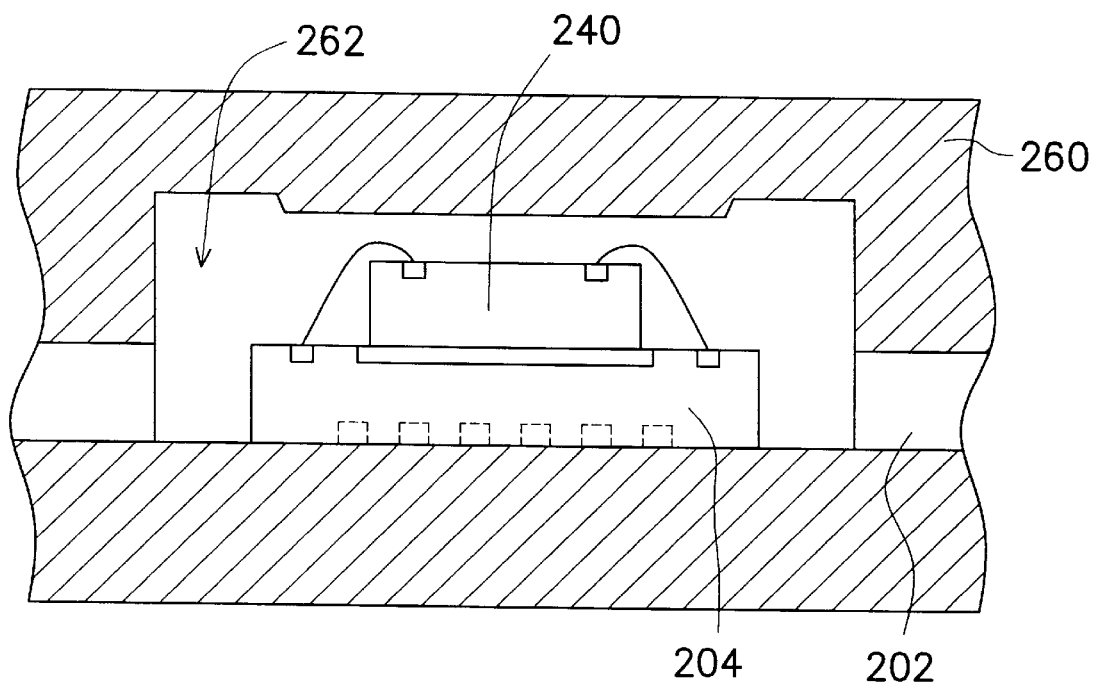

Referring to FIG. 3, a molding process is carried out to form at least a cavity 262 in a mold 260. The package unit 204 and the multimedia chip 240 are located in each cavity 262, which corresponds to each package unit 204. The connecting bars 202 are gripped by the mold 260, which allows the fluid of a package material to fill in the cavity 262. Once the mold cools down and is removed, the structure shown in FIG. 4 is obtained.

Figure 4:
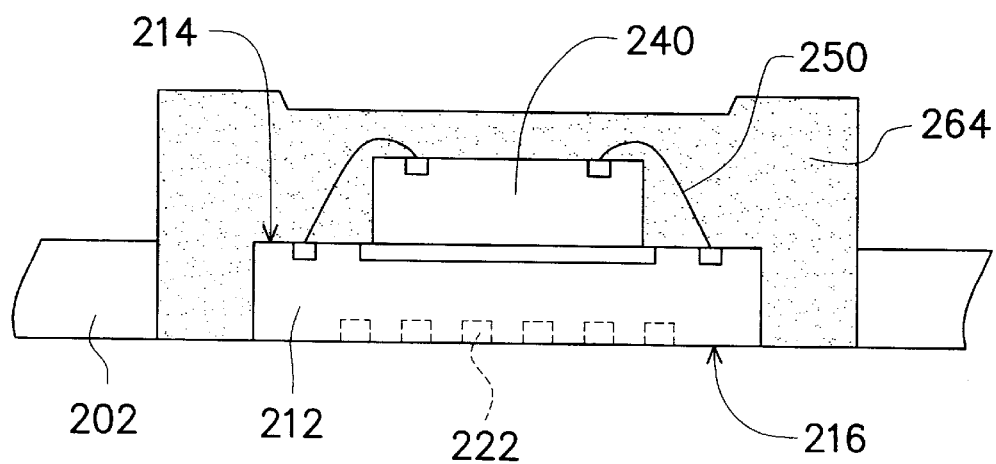

Referring to FIG. 4, the molding compound 264 encapsulates the first surface 214 of the substrate unit 212, the multimedia chip 240 and conductive wires 250, exposing the second surface 216 of the substrate unit 212 and the external nodes 222. A singulating process is carried out to separate the package unit 204 and the connecting bars 202.

Figure 5:
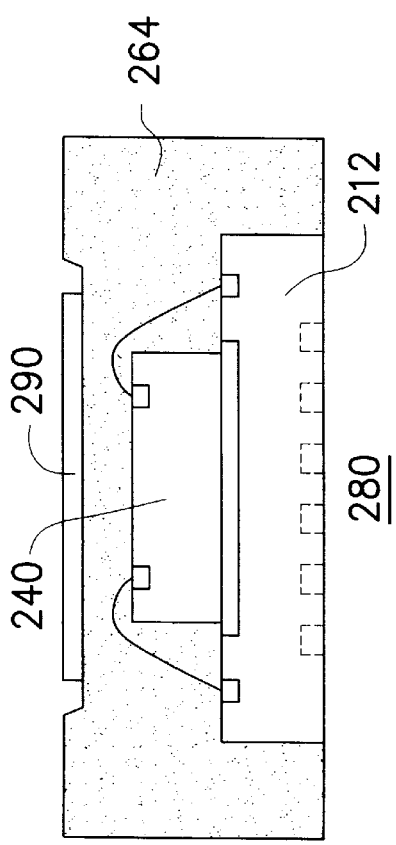

Referring to FIG. 5, a testing process is carried out to test whether every packaging unit 280 passes the requirements of the quality standard. A label 290 is adhered on a surface of every molding compound 264, whereby each packaging unit 280 comprises a substrate unit 212, in which a plurality of multimedia chips 240 is attached.

Compared to the conventional method, the preferred embodiment of the present invention provides a simple fabrication process of a multimedia chip (MMC) packaging so that the step of adding a cap is omitted. The cost of fabricating the cap and the cost of adding the cap can be omitted, so the overflow problem of the adhesive material and the detaching problem of the cap bonding onto the packaging unit can be prevented. Although the step of adding the cap is omitted, the thickness of the whole MMC package remains unchanged. The thickness of the cap can be utilized and replaced by increasing the thickness of the substrate and the package material. For example, the thickness of the substrate can be increased up to about 0.36 mm or 0.56 mm. When the thickness of the substrate increases, a warpage problem can be reduced. The production cost can be reduced, and the production yield thus is increased.

Figure 6:
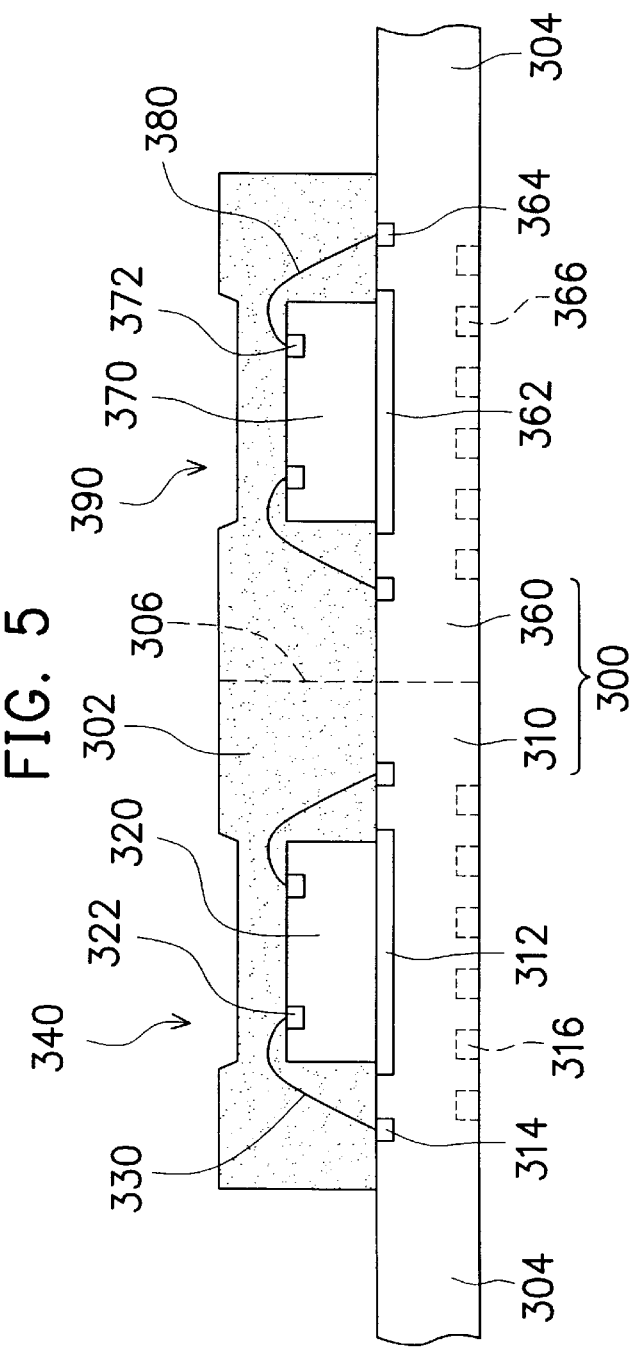
FIG. 6 is a schematic cross-sectional view of a multimedia chip (MMC) package in accordance with a second embodiment of the present invention.
Figure 6A:
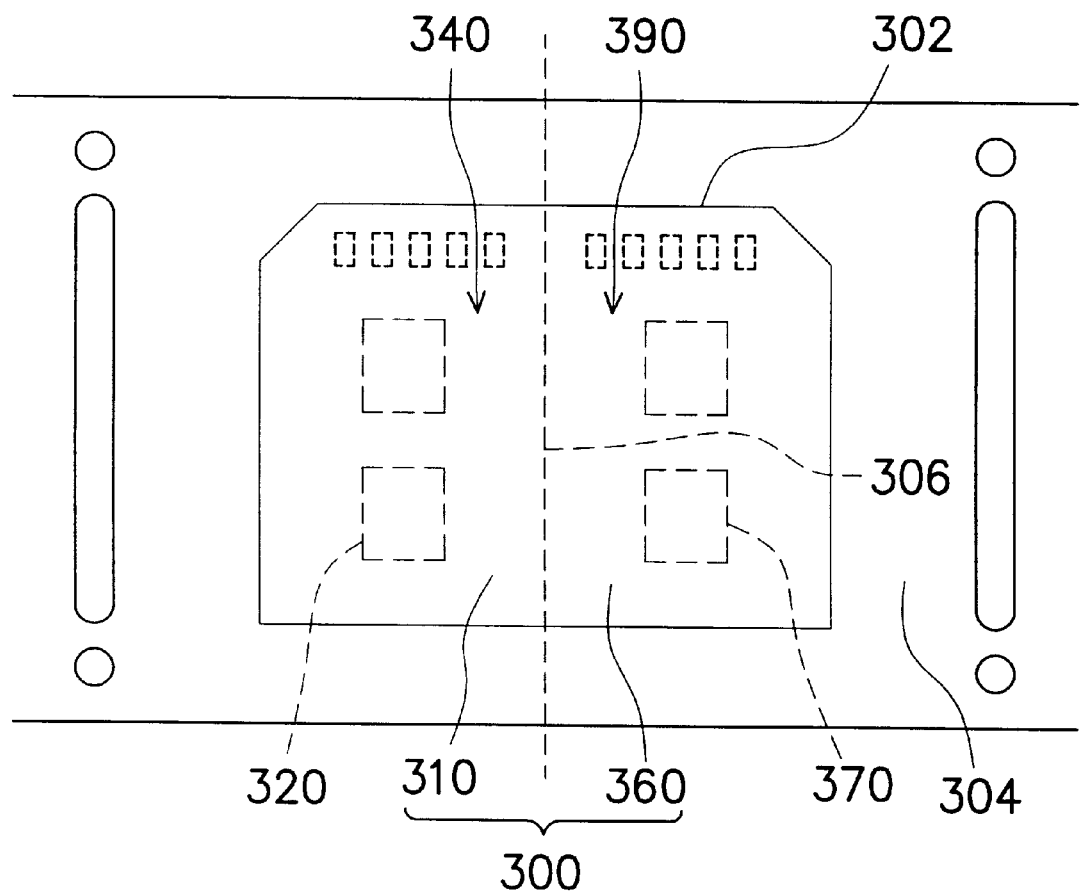
FIG. 6A is a schematic top view of FIG. 6.

FIG. 6 illustrates a schematic cross-sectional view of a MMC package in accordance with a second embodiment of the present invention, and FIG. 6A is a schematic top view of FIG. 6. In the above-mentioned MMC package, each package unit comprises only one substrate unit. However, the installation of the substrate unit is not limited to the above-mentioned method. Referring to FIG. 6, each package unit 300 comprises a plurality of substrate units such as 310, 360 in accordance with the second embodiment of the present invention. Substrate unit 310 is defined as a first substrate unit, and substrate unit 360 is defined as a second substrate unit. A plurality of first multimedia chips 320 adheres on a first die pad 312 of the first substrate unit 310, and a first bonding pad 322 of the first multimedia chips 320 is electrically connected to a first node 314 of the first substrate unit 310 by a plurality of first conductive wires 330. A plurality of second multimedia chips 370 adheres on a second die pad 362 of the second substrate unit 360, and a second bonding pad 372 of a plurality of second multimedia chips 370 is electrically connected to a second node 364 of the second substrate unit 360 by a plurality of second conductive wires 380. A plurality of first external nodes 316 of the first substrate unit 310 is electrically connected to the first node 314. A plurality of second external nodes 366 of the second substrate unit 360 is electrically connected to the second node 364.

A molding process is carried out, in which a molding compound is filled into a mold and every cavity of the mold (not shown) can contain a package unit 300. The first substrate unit 310, the second substrate unit 360, the first multimedia chips 320 and the second multimedia chips 370 are packaged together to form one structure. The corresponding first substrate unit 310 and the first multimedia chips 320 make up a first packaging unit 340. The corresponding second substrate unit 360 and the second multimedia chips 370 make up a second packaging unit 390. A singulating process is carried out to separate the packaging unit 300 and a plurality of connecting bars 304 by a punching or sawing method. In order to separate the first packaging unit 340 and the second packaging unit 390, a step of singulating along a line 306 is needed. Since this singulating process is the same as the above-mentioned first embodiment, the process is not described in detail.

Figure 7:
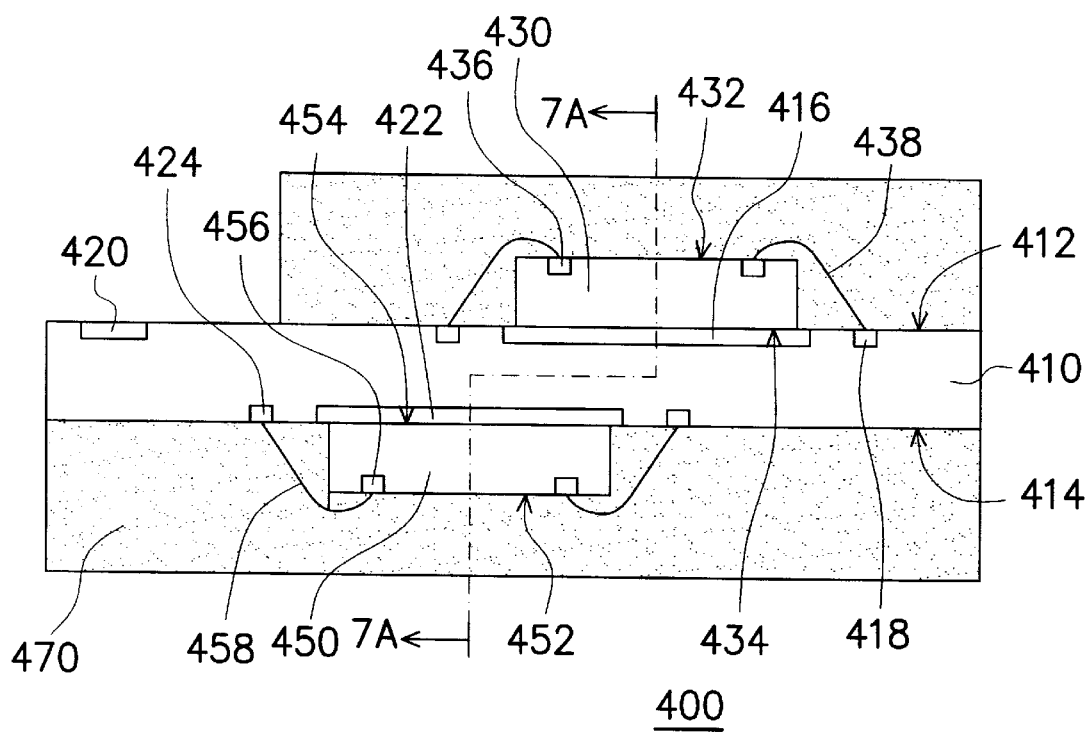
FIG. 7 is a schematic cross-sectional view of a MMC package in accordance with a third embodiment of the present invention.
Figure 7A:
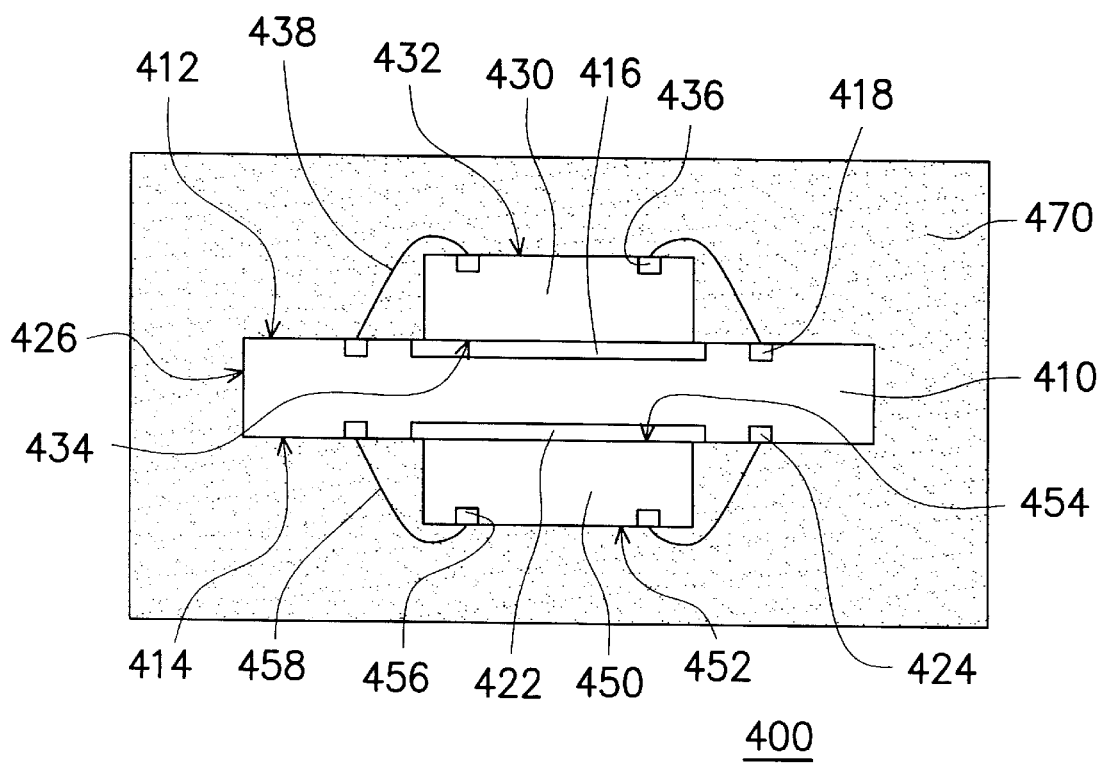
FIG. 7A is a schematic cross-sectional view in accordance with the cutting line 7A—7A of FIG. 7.

FIG. 7 illustrates a schematic cross-sectional view of a multimedia chip (MMC) package in accordance with a third embodiment of the present invention, and FIG. 7A illustrates a schematic cross-sectional view in accordance with the cutting line 7A—7A shown in FIG. 7.

In the above-mentioned embodiments, the multimedia chips are located on the same surface of the substrate unit. However, the location of the multimedia chips (MMC) can be modified in accordance with the embodiment discussed as follows. The MMC package 400 comprises a substrate unit 410, at least one first multimedia chip 430, at least one second multimedia chip 450 and a molding compound 470. The substrate unit 410 has a first surface 412 and a corresponding second surface 414, on which at least a first die pad 416, a plurality of first nodes 418, and a plurality of external nodes 420 are formed on the first surface 412. The second surface 414 of the substrate unit 410 comprises at least a second die pad 422 and a plurality of second nodes 424. The external nodes 420 are electrically connected to the first nodes 418 and the second nodes 424, and the external nodes 420 can also connect to the external circuits (not shown). The location of the external nodes 420 is near a peripheral region of the substrate unit 410, and the external nodes 420 are a rectangular or a square shape. The first multimedia chip 430 has a first active surface 432 and a corresponding first back surface 434. A plurality of first bonding pads 436 is formed on the first active surface 432. The first back surface 434 of the first multimedia chip 430 is adhered on the first die pad 416 of the substrate unit 410. A plurality of first conductive wires 438 electrically connects the first bonding pads 436 to the first nodes 418. A second multimedia chip 450 has a second active surface 452 and a corresponding second back surface 454. Second bonding pads 456 are formed on the second active surface 452 of the multimedia chip 450. A second die pad 422 of the substrate unit 410 is adhered on the second back surface 454 of the multimedia chip 450. A plurality of second conductive wires 458 electrically connects the second bonding pads 456 to the second nodes 424. A molding compound 470 encapsulates the first multimedia chip 430, the second multimedia chip 450, the first conductive wires 438, the second conductive wires 458, the first surface 412, the second surface 414 and the side surfaces 426 of the substrate unit 410. The external nodes 420 are exposed.

In the above-mentioned third embodiment, the first multimedia chip 430 and the second multimedia chip 450 are located respectively at the first surface 412 and the second surface 414 of the substrate unit 410. The volume of the whole package 400 is thus reduced. However the method of applying a MMC package is not limited to the third embodiment.

Figure 7B:
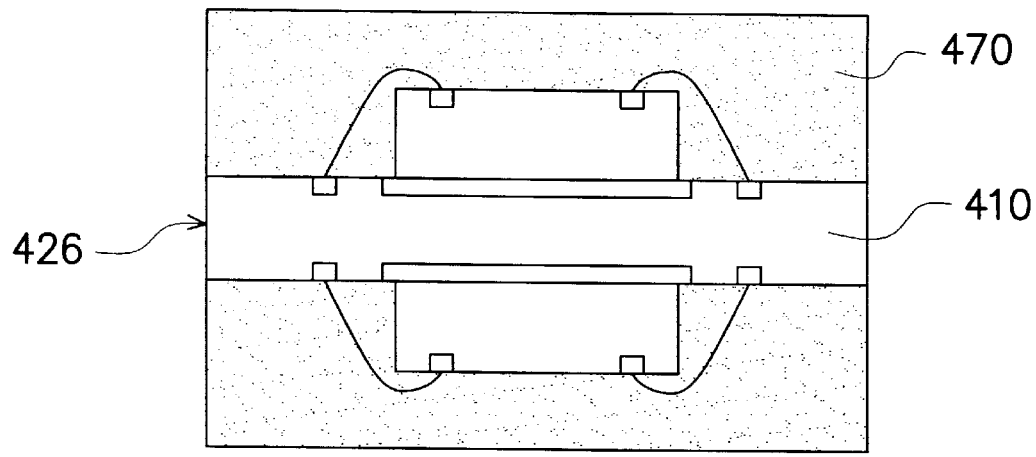
FIG. 7B is a schematic cross-sectional view in accordance with the cutting line 7A—7A of FIG. 7 of a MMC package in accordance with a fourth embodiment of the present invention.

FIG. 7B illustrates a cross-sectional view in accordance with the cutting line 7A—7A in FIG. 7 of a MMC package in accordance with a fourth embodiment of the present invention. The steps of the packaging method of the fourth embodiment are similar to that of the third embodiment except for the step of applying the molding compound. The molding compound encapsulates the first surface 412 and the second surface 414 of the substrate unit 410, and exposes the side surfaces 426 of the substrate unit 410.

Figure 8:
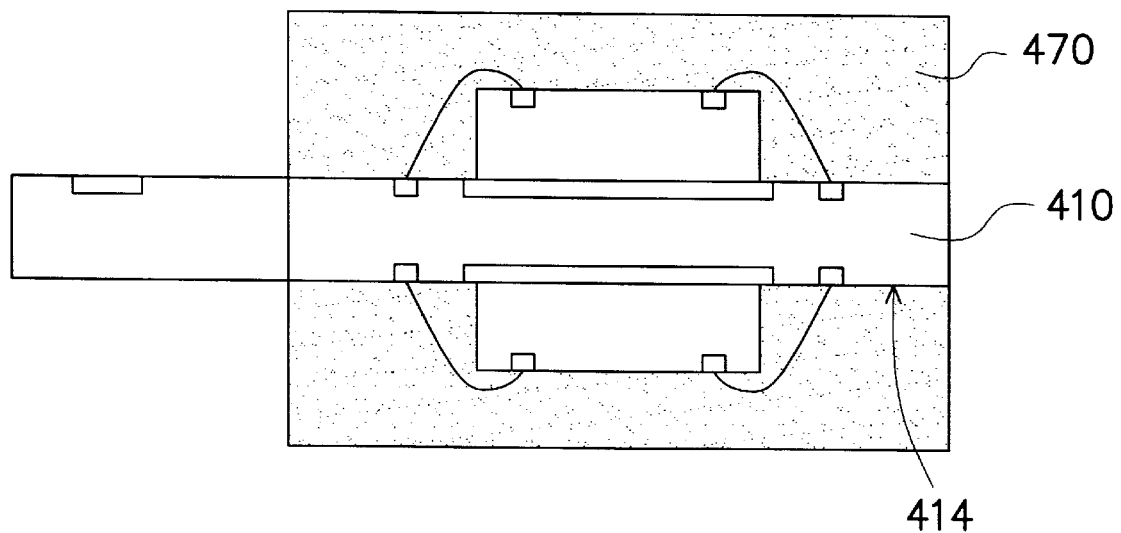
FIG. 8 is a schematic cross-sectional view of a MMC package in accordance with a fifth embodiment of the present invention.

FIG. 8 illustrates a cross-sectional view of a MMC package in accordance with a fifth embodiment of the present invention. The fifth embodiment is also similar to the third embodiment, but the molding compound 470 encapsulates only a portion of the second surface 414 of the substrate unit 410.

The foregoing description and illustrations contained herein show the advantages of the present invention, which are as follows:

1. The present invention provides an improved multimedia chip package and fabrication method thereof, wherein the multimedia chip package is fabricated into one structure without adding a cap. The fabrication process is not only simplified, but also the cost of fabricating the cap and the integration process can be omitted. The problems of the overflowing adhesive material and the cap detached from the bonding also can be avoided.
2. The thickness of the whole package of the present invention is the same as the prior art, because the thickness of the cap is replaced by increasing the thickness of the substrate and the molding compound. Since the thickness of the substrate is increased, a warpage problem can be prevented. The production cost can be reduced, and the production yield thus is increased.
3. The present invention also provides a method of forming a plurality of multimedia chips on the top and bottom surfaces of the substrate unit to reduce the package volume.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A multimedia chip package, comprising:

the substrate unit, and a plurality of external nodes is formed on the second surface of the substrate unit;

at least a multimedia chip having an active surface and a corresponding back surface, wherein a plurality of bonding pads is formed on the active surface of the multimedia chip, the back surface of the multimedia chip is adhered on the die pad of the substrate unit, and a plurality of conductive wires electrically connects the bonding pad to the nodes;

a molding compound encapsulating the multimedia chip, the first surface of the substrate unit and the conductive wires, and exposing the second surface of the substrate unit and the external nodes; and a label is adhered on a surface of the molding compound.

2. The package of claim 1, wherein the external nodes are arranged in a peripheral region near the second surface of the substrate unit.

3. The package of claim 1, wherein the external nodes are square, rectangular or a combination thereof.

4. A multimedia chip package, comprising:

a substrate unit, having a first surface and a corresponding second surface, wherein at least a die pad, a plurality of first nodes and a plurality of external nodes are formed on the first surface of the substrate unit, and at least a second die pad and a plurality of second nodes are formed on the second surface of the substrate unit;

at least a first multimedia chip having a first active surface and a corresponding first back surface, wherein a plurality of first bonding pads is formed on the first active surface of the first multimedia chip, wherein the first back surface of the first multimedia chip is adhered on the first die pad of the substrate unit and a plurality of first conductive wires electrically connects the first bonding pads to the first nodes;

at least a second multimedia chip having a second active surface and a corresponding second back surface, wherein a plurality of second bonding pads is formed on the second active surface of the second multimedia chip, wherein the second back surface of the second multimedia chip is adhered on a second die pad of the substrate unit and a plurality of second conductive wires electrically connects the second bonding pads to the second nodes; and a molding compound encapsulating the first multimedia chip, the second multimedia chip, the first conductive wires, the second conductive wires, and a portion of the first surface of the substrate unit, and exposing the external nodes.

5. The package of claim 4, wherein the molding compound encapsulates the second surface of the substrate unit.

6. The package of claim 4, wherein the molding compound encapsulates a portion of the second surface of the substrate unit.

7. The package of claim 4, wherein the substrate unit has side surfaces exposed by the molding compound.

8. The package of claim 4, wherein the molding compound encapsulates the side surfaces of the substrate unit.

9. The package of claim 4, wherein the external nodes are located near a peripheral region of the first surface of the substrate unit.

10. The package of claim 4, wherein the external nodes are rectangular, square or a combination thereof in shape.

* * * * *